United States Patent
Lu et al.

(10) Patent No.: US 8,053,296 B2
(45) Date of Patent: Nov. 8, 2011

(54) CAPACITOR FORMED ON A RECRYSTALLIZED POLYSILICON LAYER

(75) Inventors: Jiong-Ping Lu, Richardson, TX (US); Haowen Bu, Plano, TX (US); Clint Montgomery, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 110 days.

(21) Appl. No.: 12/478,512

(22) Filed: Jun. 4, 2009

(65) Prior Publication Data

US 2010/0159665 A1     Jun. 24, 2010

Related U.S. Application Data

(62) Division of application No. 10/722,013, filed on Nov. 25, 2003, now abandoned.

(51) Int. Cl.
*H01L 21/00* (2006.01)
(52) U.S. Cl. .......... 438/166; 438/486; 438/487
(58) Field of Classification Search .......... 438/239, 438/244, 253, 255, 256, 166, 396, 398, 482, 438/486, 487
See application file for complete search history.

(56) References Cited

U.S. PATENT DOCUMENTS

| 4,476,475 A | 10/1984 | Naem et al. |
|---|---|---|
| 4,667,217 A | 5/1987 | Janning |
| 4,916,504 A | 4/1990 | Nakahara |
| 5,225,697 A | 7/1993 | Malhi et al. |
| 5,631,188 A * | 5/1997 | Chang et al. .......... 438/253 |
| 6,198,121 B1 * | 3/2001 | Sung .......... 257/296 |
| 6,204,105 B1 | 3/2001 | Jung |
| 6,218,233 B1 | 4/2001 | Takemura |
| 6,246,084 B1 | 6/2001 | Kim |
| 6,509,601 B1 | 1/2003 | Lee et al. |
| 6,583,038 B2 | 6/2003 | Hu |
| 6,642,092 B1 | 11/2003 | Voutsas et al. |
| 6,642,097 B2 | 11/2003 | Tu |
| 2001/0050390 A1 * | 12/2001 | Kawai et al. .......... 257/301 |
| 2003/0058678 A1 | 3/2003 | Kim et al. |
| 2004/0129963 A1 | 7/2004 | Amo et al. |

FOREIGN PATENT DOCUMENTS

JP     60-148163     8/1985

* cited by examiner

*Primary Examiner* — Kevin M Picardat

(74) *Attorney, Agent, or Firm* — Warren L. Franz; Wade J. Brady, III; Frederick J. Telecky, Jr.

(57) ABSTRACT

The present invention provides a semiconductor device, a method of manufacture therefor, and an integrated circuit including the semiconductor device. The semiconductor device, among other elements, includes a recrystallized polysilicon layer 148 located over a gate electrode layer 143, a capacitor 170 located on the recrystallized polysilicon layer 148. The capacitor 170, in this embodiment, includes a first electrode 173, an insulator 175 located over the first electrode 173, and a second electrode 178 located over the insulator 175.

10 Claims, 7 Drawing Sheets

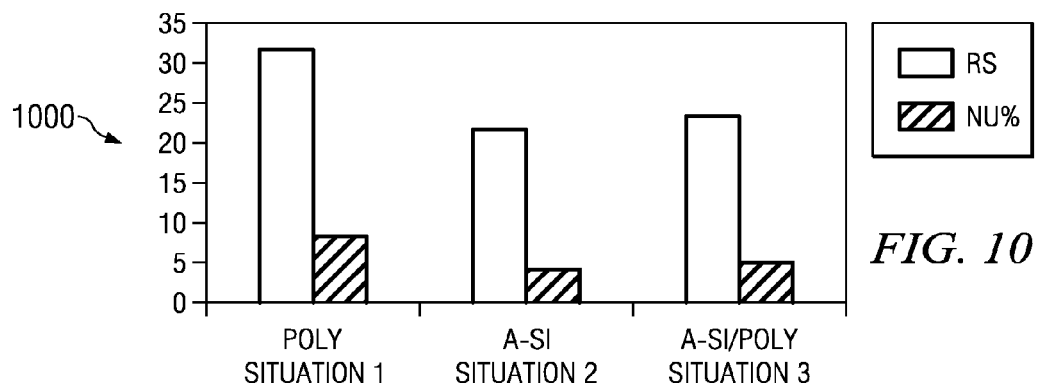
*FIG. 10*
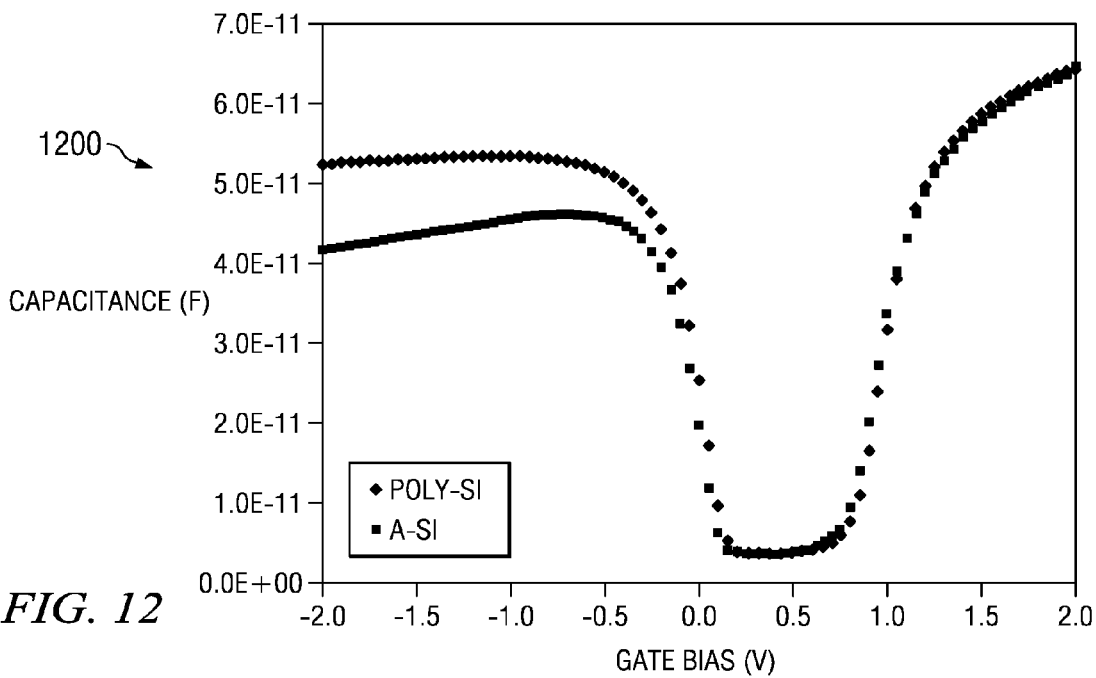
*FIG. 11*
*FIG. 12*

CAPACITOR FORMED ON A RECRYSTALLIZED POLYSILICON LAYER

This is a division of application Ser. No. 10/722,013, filed Nov. 25, 2003, the entirety of which is incorporated by reference herein.

BACKGROUND

The present invention is directed to a method of manufacturing a semiconductor device including a capacitor formed on a recrystallized polysilicon layer.

Modern electronic equipment, such as televisions, telephones, radios and computers, is generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density and feasibility of use.

In a DRAM, each memory cell typically includes an access transistor coupled to a storage capacitor. In order to fabricate high density DRAMs, the storage capacitors must take up less planar area in the memory cells. As storage capacitors are scaled down in dimensions, a sufficiently high storage capacity must be maintained. Efforts to maintain storage capacity have concentrated on building three-dimensional capacitor structures that increase the capacitor surface area. The increased surface area provides for increased storage capacity. Three-dimensional capacitor structures typically include trench capacitors and stacked capacitors. While trench capacitors are still used, many of the capacitors currently used are of the stacked capacitor type.

Stacked capacitors typically include first and second conductive electrodes separated by an insulator material. Often the first, or lower electrode, comprises a material such as cobalt silicide, the insulator material comprises a material such as silicon dioxide, and the second, or upper electrode, comprises a material such as titanium nitride. This is particularly the case when striving for high performance capacitors.

While the above-discussed capacitors are used as high performance capacitors, their use is not without certain drawbacks. One such drawback stems from the difficulty in forming substantially planar first, or lower electrodes. Specifically, the first, or lower electrodes, presently have varying and unpredictable amounts of roughness. This unfortunately causes the capacitors to have varying and unpredictable amounts of capacitance, as a result of the increased or decreased surface area of the first, or lower electrode. It has been observed that the varying and unpredictable amounts of roughness are particularly evident when the first, or lower electrode, is formed over a polysilicon substrate. Unfortunately, these capacitors are often formed directly on the polysilicon gate of the underlying transistor, which exaggerates this problem.

Accordingly, what is needed in the art is a capacitor that does not experience the lower electrode roughness experienced by the prior art capacitors.

SUMMARY

To address the above-discussed deficiencies of the prior art, the present invention provides a method of manufacturing a semiconductor device or integrated circuit. The semiconductor device, among other elements, includes a recrystallized polysilicon layer located over a gate electrode layer, and a capacitor located on the recrystallized polysilicon layer. The capacitor, in this embodiment, includes a first electrode, an insulator located over the first electrode, and a second electrode located over the insulator.

The method for manufacturing the semiconductor device includes forming an amorphous silicon layer over a substrate, then changing the amorphous silicon layer to a recrystallized polysilicon layer. The method further includes creating a capacitor on the recrystallized polysilicon layer, wherein the capacitor includes a first electrode, an insulator located over the first electrode, and a second electrode located over the insulator.

The device embodied in an integrated circuit may include transistors located over a substrate, wherein at least one of the transistors includes a gate electrode stack comprising a recrystallized polysilicon layer located over a gate electrode layer; a capacitor located on the recrystallized polysilicon layer, wherein the capacitor includes a first electrode, an insulator located over the first electrode, and a second electrode located over the insulator; and an interlevel dielectric layer located over the substrate, the interlevel dielectric layer having interconnects located therein for contacting at least one of the gate electrode stack or the capacitor.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying drawings. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 10 is a bar graph representation of sheet resistance (Rs) and surface nonuniformity (NU %) for three different situations of devices;

FIG. 11 is a table showing the surface roughness measured using an atomic force microscope (AFM) of samples similar to the three different situations illustrated in FIG. 10;

FIG. 12 is a graphical comparison of the inversion capacitance of a polysilicon gate electrode layer and a recrystallized polysilicon gate electrode layer.

DETAILED DESCRIPTION OF EXAMPLE EMBODIMENTS

Figure 1A:
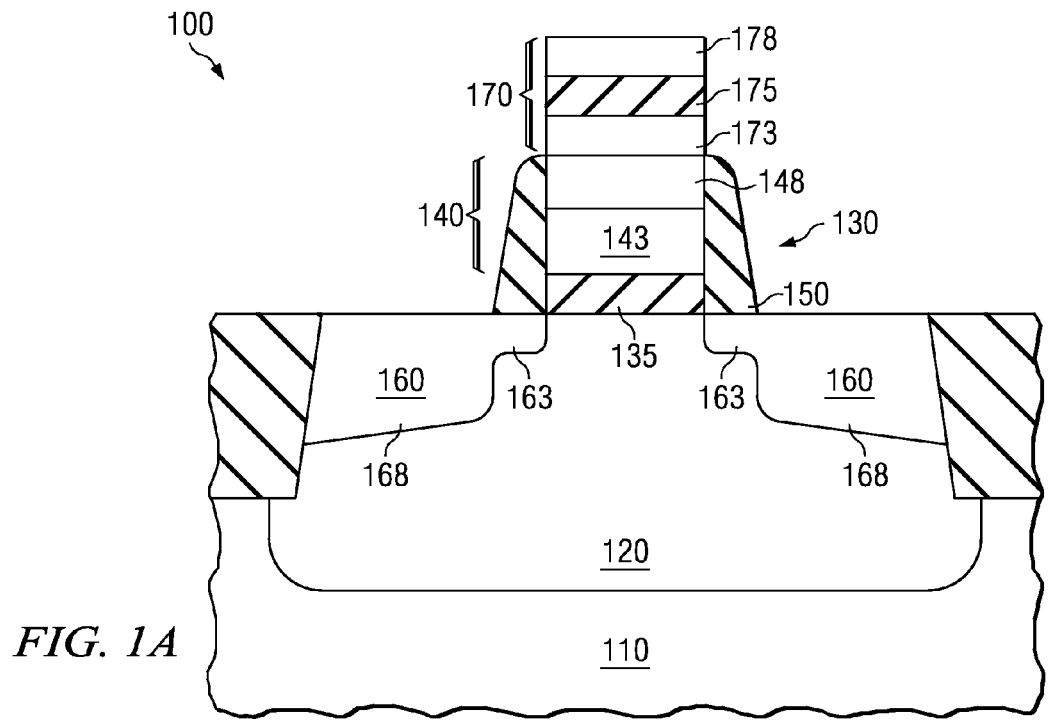
FIG. 1A is a cross-sectional view of one embodiment of a semiconductor device constructed according to the principles of the present invention.

FIG. 1A illustrates one embodiment of a semiconductor device 100 constructed according to the principles of the present invention. The illustrated semiconductor device 100 includes a substrate 110, a well region 120 located within the substrate 110, and a gate structure 130 located over the substrate 110 and well region 120. The gate structure 130 includes a gate oxide 135 located over the substrate 110, as well as a gate electrode stack 140 located over the gate oxide 135. In the particular embodiment shown, the gate electrode stack 140 includes a gate electrode layer 143, such as a polysilicon gate electrode, and a recrystallized polysilicon layer 148 located over the gate electrode layer 143. The recrystallized polysilicon layer 148 may have a final thickness that ranges from about 7 nm to about 35 nm, among others. Flanking both sides of the gate electrode stack 140 and gate oxide 135 of the gate structure 130 are gate sidewall spacers 150. The semiconductor device 100 further includes conventional source/drain regions 160 located within the substrate 110. The source/drain regions 160, as is common, may each include a lightly doped extension implant 163, as well as a higher doped source/drain implant 168.

Located on the recrystallized polysilicon layer 148 of the gate electrode stack 140 is a capacitor 170. The capacitor 170, which often is a high performance capacitor, includes a first electrode 173, or in this instance a lower electrode, located on the recrystallized polysilicon layer 148. The capacitor 170 further includes an insulator 175 located over the first electrode 173, as well as a second electrode 178, or in this instance an upper electrode, located over the insulator 175.

In accordance with an aspect of the present invention, the first electrode 173, which may comprise a silicide or more particularly a cobalt silicide, may have a reduced surface roughness. For example, the first electrode 173 may have a surface roughness less than about 2.5 nm, or in an example embodiment a surface roughness ranging from about 1 nm to about 2 nm. As the first electrode 173 is formed on the recrystallized polysilicon layer 148 rather than a conventional polysilicon layer or another different material, these reduced surface roughness values are attainable. The first electrode, among others, may also have a thickness that ranges from about 15 nm to about 70 nm.

Figure 1B:
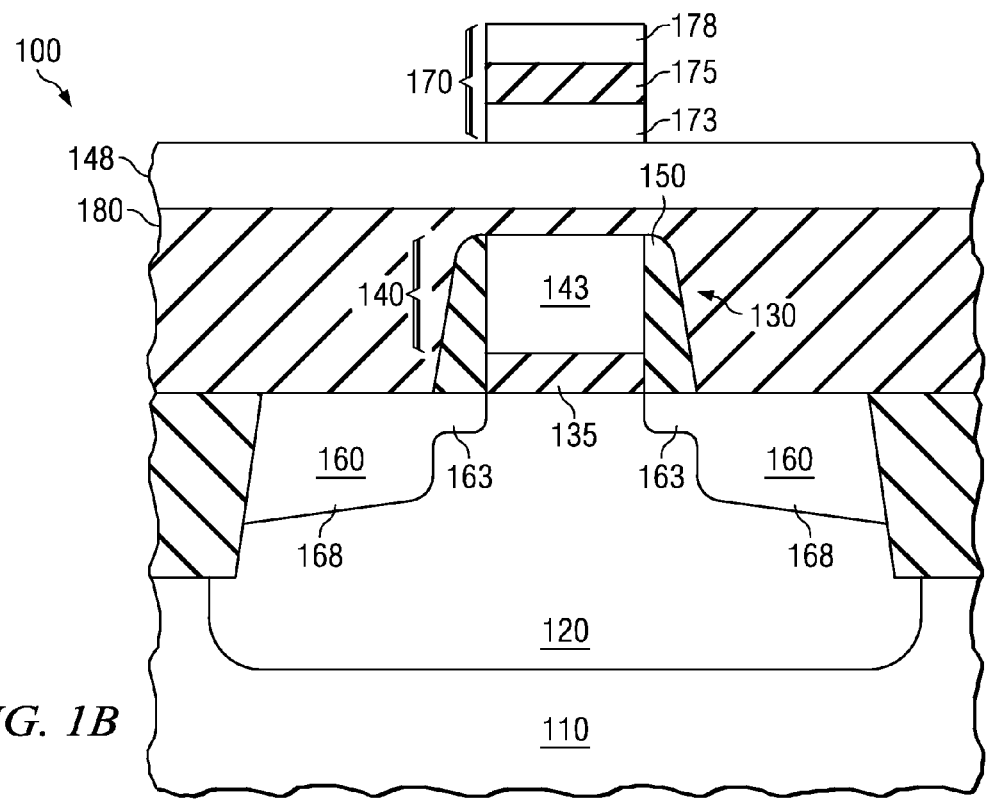
FIG. 1B illustrates an embodiment of the present invention wherein an additional layer, or layers, of material interpose the gate electrode layer and the recrystallized polysilicon layer.

While the embodiment of FIG. 1A illustrates that the recrystallized polysilicon layer 148 is located on the gate electrode layer 143, those skilled in the art understand that this must not always be the case. For instance, turning to FIG. 1B, illustrated is an embodiment of the present invention wherein an additional layer 180, or layers, of material may be interposed between the gate electrode layer 143 and the recrystallized polysilicon layer 148. In this instance the first electrode 173 would still be located on the recrystallized polysilicon layer 148, thereby providing the desired surface roughness, however, the recrystallized polysilicon layer 148 would not be located on the gate electrode layer 143, but over the gate electrode layer 143.

FIGS. 2-9 illustrated steps in an embodiment of the manufacture of a semiconductor device similar to the semiconductor device 100 depicted in FIG. 1A.

Figure 2:
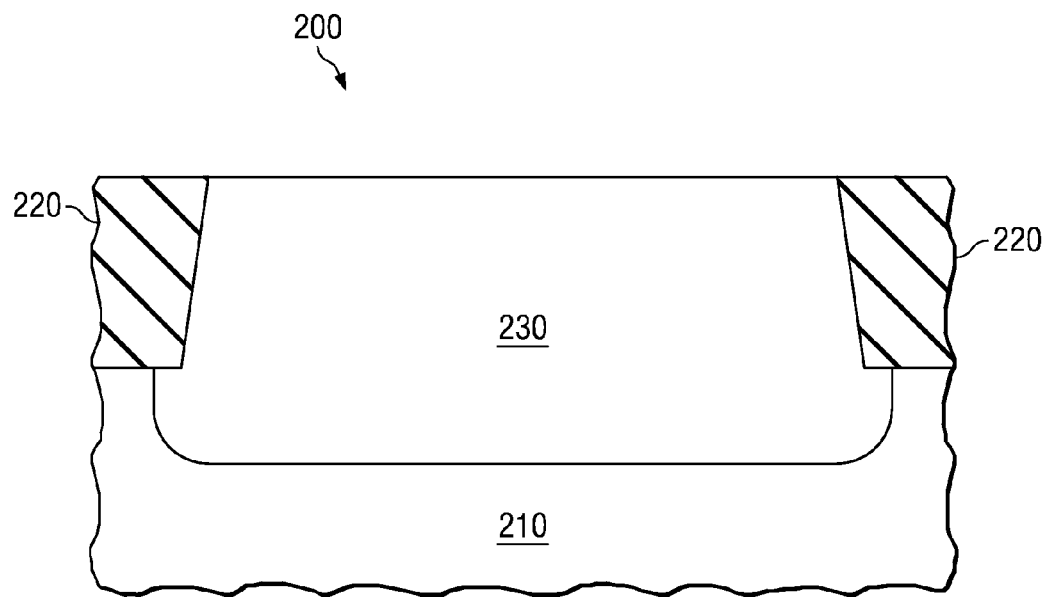
FIGS. 2-9 are cross-sectional views showing various steps in the manufacture of a semiconductor device, according to embodiments of the invention.

FIG. 2 illustrates a partially completed semiconductor device 200 including a substrate 210. The substrate 210 may, in an example embodiment, be any layer located in the partially completed semiconductor device 200, including a wafer itself or a layer located above the wafer (e.g., epitaxial layer). In the embodiment illustrated in FIG. 2, the substrate 210 is a P-type semiconductor substrate; however, one skilled in the art understands that the substrate 210 could be an N-type substrate without departing from the scope of the present invention. In such a case, each of the dopant types described throughout the remainder of this document would be reversed. For brevity, no further reference to this opposite scheme will be discussed.

Located within the substrate 210 in the embodiment shown in FIG. 2 are shallow trench isolation regions 220 that isolate the semiconductor device 200 from other devices located proximate thereto. As those skilled in the art understand the various steps used to form these conventional shallow trench isolation regions 220, no further detail will be given.

In the illustrative embodiment of FIG. 2, also formed within the substrate 210 is a well region 230. The well region 230, in light of the P-type semiconductor substrate 210, would likely contain an N-type dopant. For example, the well region 230 would likely be doped with an N-type dopant dose ranging from about 1E13 atoms/cm$^2$ to about 1E14 atoms/cm$^2$ and at a power ranging from about 100 keV to about 500 keV, to provide a well region 230 having a peak dopant concentration generally ranging from about 5E17 atoms/cm$^3$ to about 1E19 atoms/cm$^3$.

Figure 3:
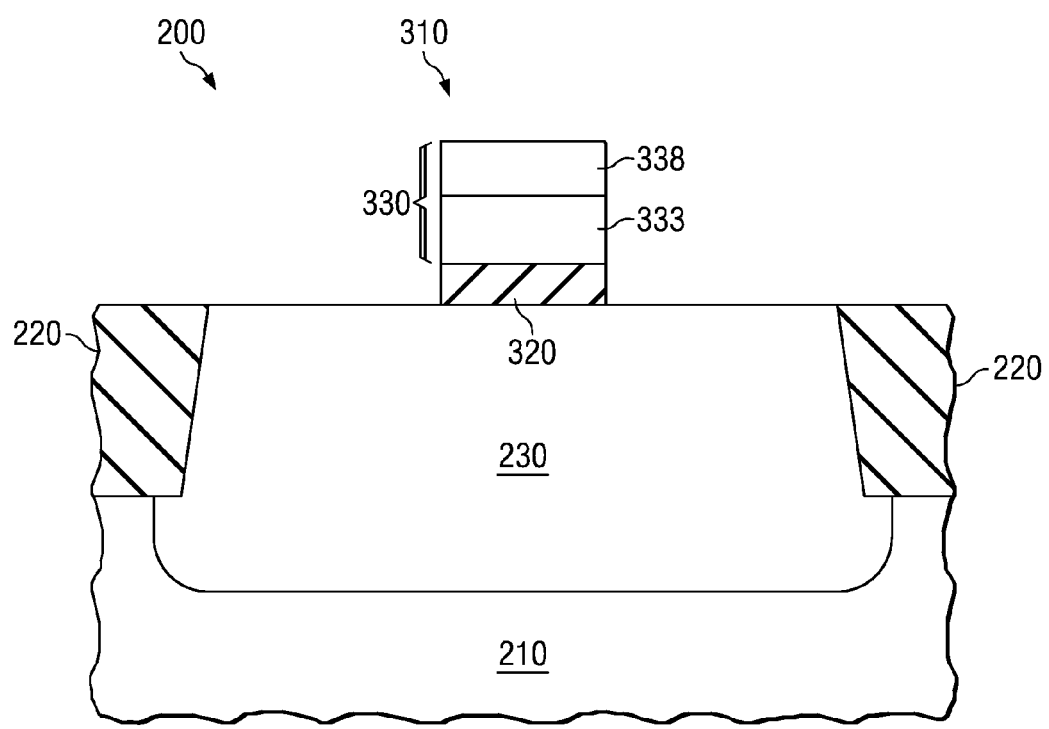

FIG. 3 illustrates semiconductor device 200 after formation of a gate structure 310 over the substrate 210. As is illustrated in FIG. 3, the gate structure 310 includes a gate oxide 320 and a gate electrode stack 330. In accordance with an aspect of the invention, at this point in the manufacturing process the gate electrode stack 330 comprises a polysilicon gate electrode 333 and an amorphous silicon layer 338.

To form the gate structure 310 shown in FIG. 3, a thin gate oxide layer, a thicker polysilicon gate electrode layer and a medium thickness amorphous silicon layer are conventionally deposited on top of one another and then patterned, resulting in the gate structure 310 shown in FIG. 3. For example, the polysilicon gate electrode layer could be deposited using a pressure ranging from about 100 ton to about 300 ton, a temperature ranging from about 620° C. to about 700° C., and a SiH$_4$ gas flow ranging from about 50 sccm to about 150 sccm. Similarly, the amorphous silicon layer could be deposited using a pressure ranging from about 100 torr to about 300 torr, a temperature ranging from about 450° C. to about 550° C., and a SiH$_4$ gas flow ranging from about 100 sccm to about 300 sccm.

While the thickness of the gate oxide may vary greatly, in an advantageous embodiment of the present invention the thickness of the polysilicon gate electrode 333 should range from about 50 nm to about 150 nm and the thickness of the amorphous silicon layer should range from about 15 nm to about 75 nm. The thickness of the amorphous silicon layer, however, is particularly dependent on the thickness of the first electrode layer that will subsequently be deposited thereon.

For example, if the subsequently deposited first electrode layer comprises cobalt, it takes approximately 3.6 nm of silicon for every 1 nm of cobalt to form about 3.5 nm of cobalt silicide. If cobalt silicide is used as the first electrode, this ratio can be used to choose a particular thickness of the amorphous silicon layer.

Figure 4:
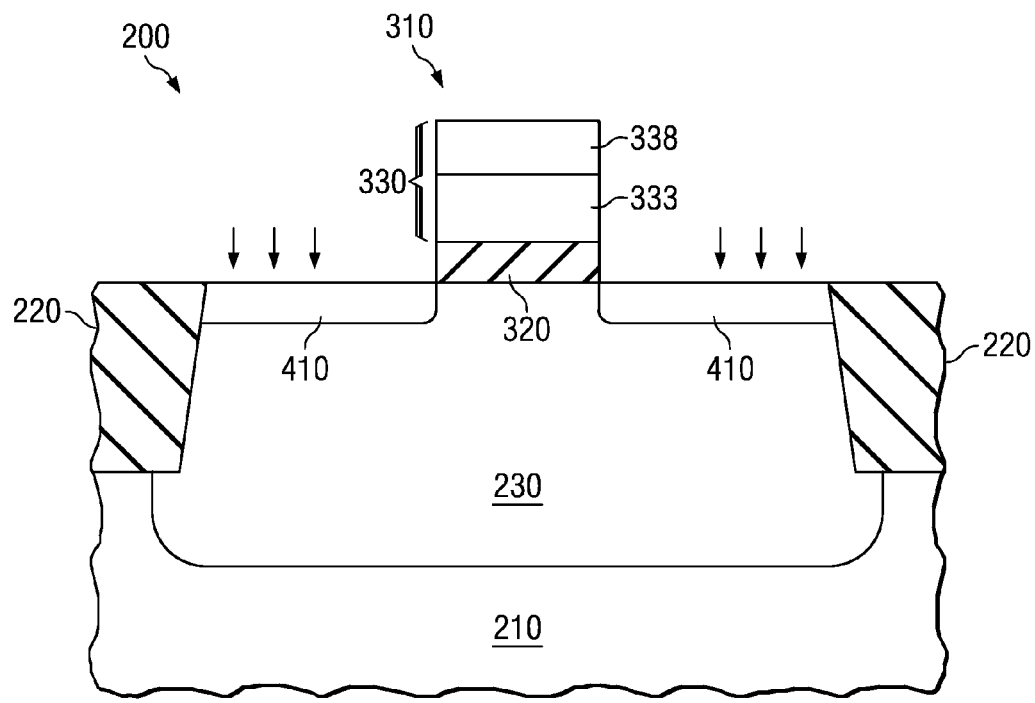

FIG. 4 illustrates semiconductor device 200 after formation of lightly doped extension implants 410 within the substrate 310. The lightly doped extension implants 410 are conventionally formed and generally have a peak dopant concentration ranging from about 1E19 atoms/cm$^3$ to about 2E20 atoms/cm$^3$. As is standard in the industry, the lightly doped extension implants 410 have a dopant type opposite to that of the well region 230 within which they are located. Accordingly, the lightly doped extension implants 410 are doped with a P-type dopant in the illustrative embodiment shown in FIG. 4.

Figure 5:
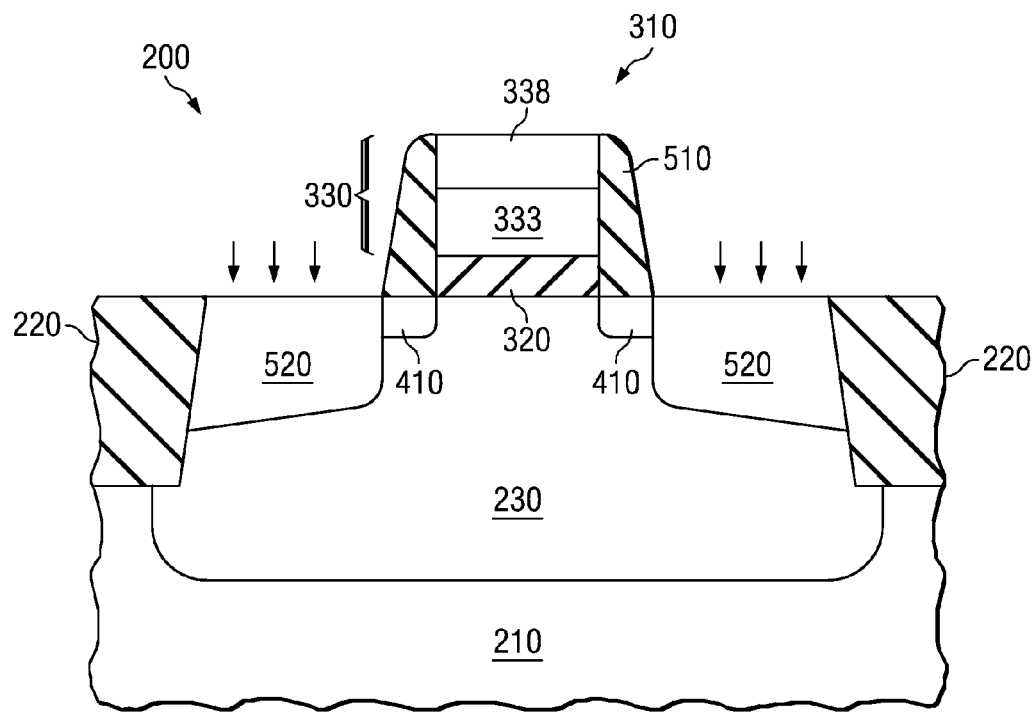

FIG. 5 illustrates semiconductor device 200 illustrated in FIG. 4 after formation of conventional gate sidewall spacers 510 and after formation of highly doped source/drain implants 520 within the substrate 210. The formation of the gate sidewall spacers 510, such as Hdd offset spacers, is conventional. Often the gate sidewall spacers 510 comprise a chemical vapor deposition (CVD) oxide and/or nitride material that has been anisotropically etched. Similarly, the highly doped source/drain implants 520 may be conventionally formed. Generally the highly doped source/drain implants 520 have a peak dopant concentration ranging from about 1E18 atoms/cm$^3$ to about 1E21 atoms/cm$^3$. Also, the highly doped source/drain implants 520 should typically have a dopant type opposite to that of the well region 230 they are located within. Accordingly, in the illustrative embodiment shown in FIG. 5, the highly doped source/drain implants 520 are doped with a P-type dopant.

Figure 6:
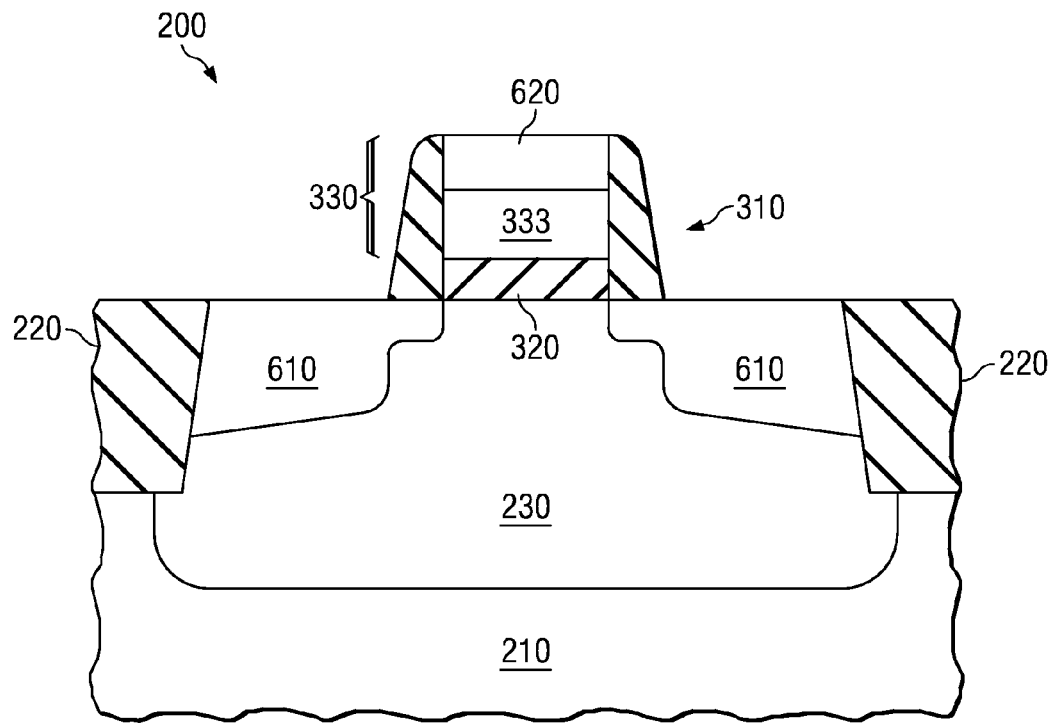

FIG. 6 illustrates semiconductor device 200 after subjecting it to a standard source/drain anneal, thereby activating source/drain regions 610. Beyond activating the source/drain regions 610, the standard source/drain anneal also converts the amorphous silicon layer 338 to a recrystallized polysilicon layer 620. It is believed that a source/drain anneal conducted at a temperature ranging from about 1000° C. to about 1100° C. and a time period ranging from about 1 second to about 5 seconds would be sufficient to accomplish both tasks. It should be noted that other temperatures, times, and processes could be used to activate the source/drain regions 610 as well as convert the amorphous silicon layer 338 to a recrystallized polysilicon layer 620.

Figure 7:
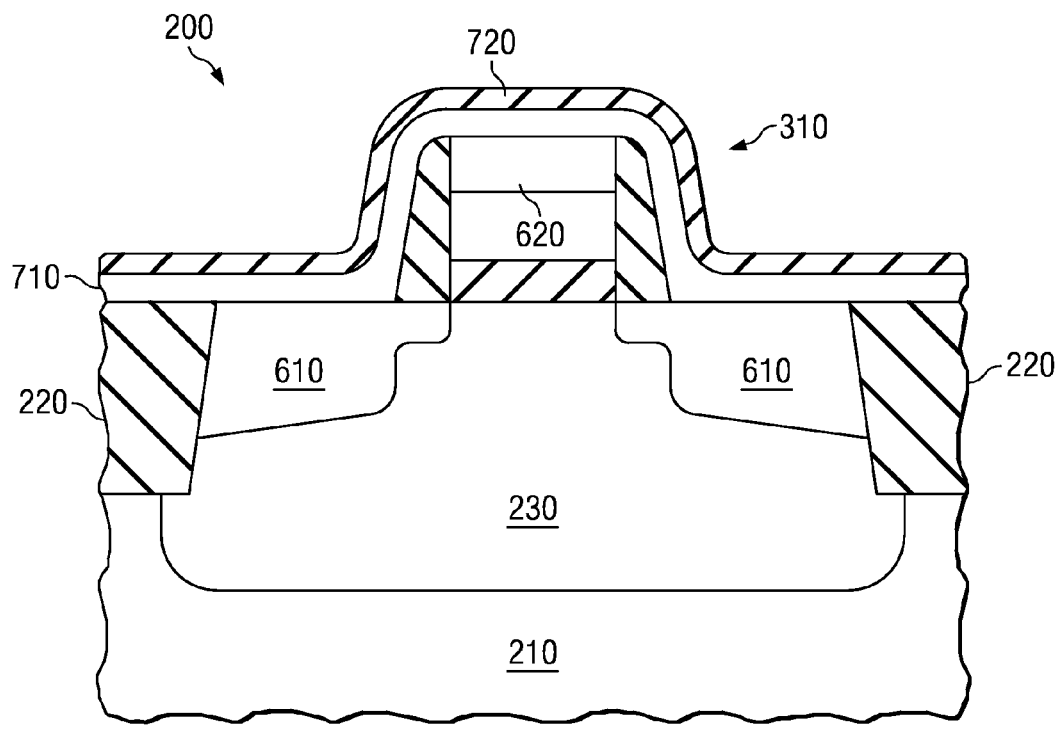

FIG. 7 illustrates semiconductor device 200 after depositing a first electrode layer 710 on the recrystallized polysilicon layer 620. The first electrode layer 710 in the embodiment shown in FIG. 7 is a thin cobalt layer, however, other materials that react with silicon to form a silicide could also be used. The first electrode layer 710 of FIG. 7 was conventionally deposited to a thickness ranging from about 4 nm to about 20 nm. Following the deposition of the first electrode layer 710, an optional capping layer 720 could be deposited thereover. The capping layer 720, which may have a thickness ranging from about 5 nm to about 30 nm, may comprise a number of different materials. For instance, without limiting the present invention to such, the capping layer 720 could comprise titanium or titanium nitride. It should be mentioned that prior to forming the first electrode layer 710 the upper surface of the recrystallized polysilicon layer 620 may be cleaned. While it is not imperative, it is believed that a surface cleaning using a diluted HF solution and/or an in-situ plasma (in the same cluster tool as the deposition chamber) would benefit the interface between the recrystallized polysilicon layer 620 and the first electrode layer 710.

Figure 8:
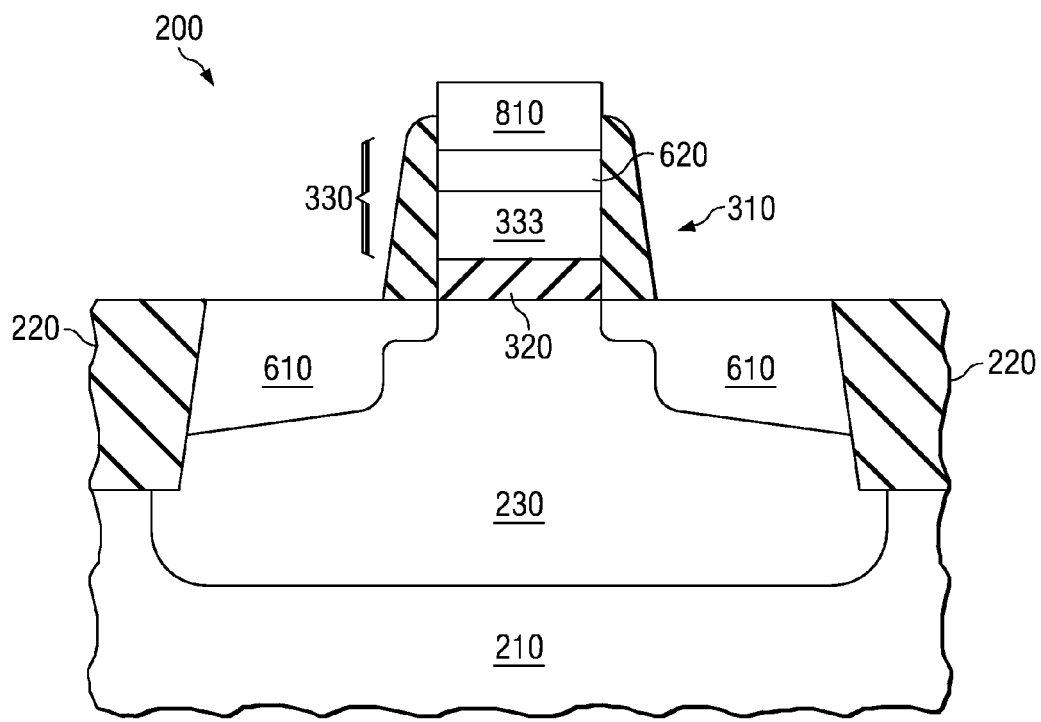

FIG. 8 illustrates semiconductor device 200 after subjecting it to a first rapid thermal anneal (RTA) process and a select etch to remove unreacted first electrode layer 710 on dielectric surface (such as sidewall and isolation) as well as an optional cap. This first RTA process attempts to cause the first electrode layer 710 to react with the recrystallized polysilicon layer 620 to form a silicide 810. In the instance where the first electrode layer 710 comprises cobalt, the first RTA process causes the cobalt to react with the recrystallized polysilicon layer 620 to form CoSi.

The first RTA process may be conducted using a variety of different temperatures and times. Nonetheless, it is believed that the first RTA process, in an example embodiment, should be conducted in a rapid thermal processing tool at a temperature ranging from about 400° C. to about 600° C. for a time period ranging from about 5 seconds to about 60 seconds. The specific temperature and time period are typically based, however, on the ability to form the silicide 810 to a desired thickness. The thickness of the resulting silicide 810 and recrystallized polysilicon layer 620 will likely be different from the original first electrode layer 710 and original recrystallized polysilicon layer 620, respectively. It is believed that the resulting silicide layer should have a thickness ranging from about 8 nm to about 40 nm and the remaining recrystallized polysilicon layer 620 should have a thickness ranging from about 7 nm to about 35 nm. This is a result of the silicide 810 consuming at least a portion of the original recrystallized polysilicon layer 620.

After forming the silicide 810 to a desired thickness, a selective etch is used to remove any unreacted first electrode layer 710, as well as to remove the capping layer 720. The selective etch, among others, could comprise a $H_2SO_4$—$H_2O_2$—$H_2O$ solution. What remains after the selective etch is the silicide 810, which in this embodiment comprises CoSi.

Figure 9:
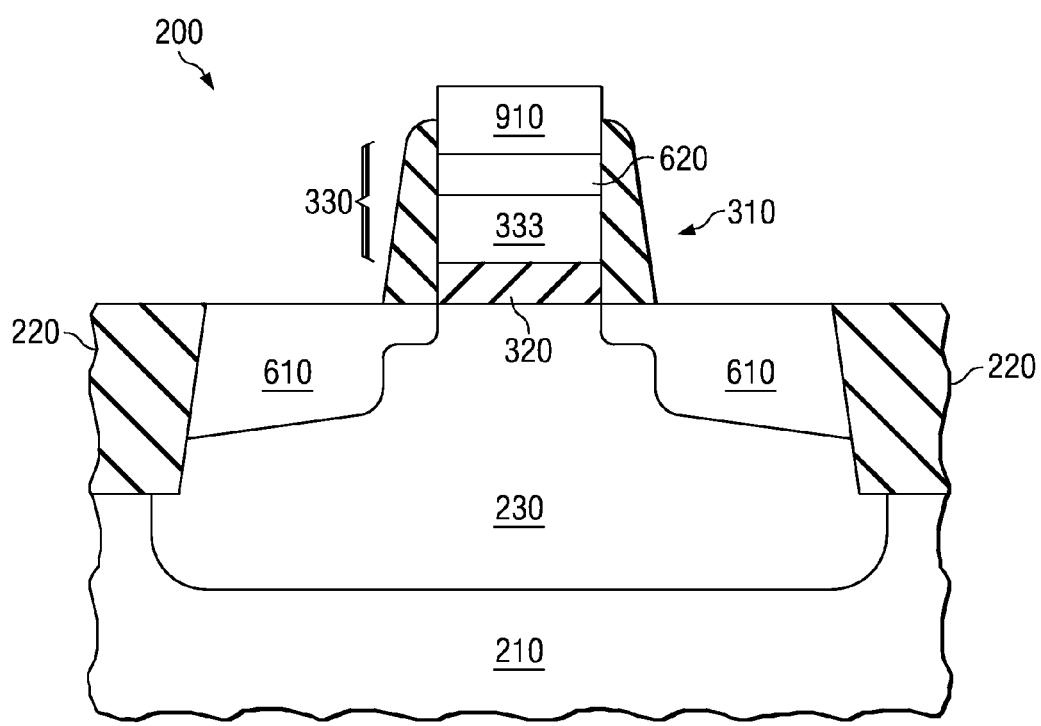

FIG. 9 illustrates semiconductor device 200 after subjecting it to a second rapid thermal anneal (RTA) process. This second RTA process attempts to cause the silicide layer 810 to further react with the recrystallized polysilicon layer 620 to form a silicide layer 910. In the instance where the silicide layer 810 comprises CoSi, the second RTA process causes the CoSi to further react with the recrystallized polysilicon layer 620 to form $CoSi_2$. In this instance, the $CoSi_2$ has a substantially lower resistivity than the CoSi formed by the first RTA process. The second RTA process may also be conducted using a variety of different temperatures and times. Nonetheless, it is believed that the second RTA process, in an example embodiment, should be conducted in a rapid thermal processing tool at a temperature ranging from about 700° C. to about 900° C. for a time period ranging from about 5 second to about 60 seconds.

After completing the silicide layer 910, the manufacture of the capacitor would continue in a conventional manner. Specifically, an insulator and a second electrode would be formed over the silicide layer 910. What results after completion of the capacitor is a device similar to the semiconductor device 100 illustrated in FIG. 1.

Turning now to FIG. 10, a graph 1000 illustrates some of the advantages that may be obtained by forming the lower electrode of the capacitor directly on the recrystallized polysilicon layer. Graph 1000 illustrates the sheet resistance (Rs) and surface nonuniformity (NU %) for three different situations. Situation 1 represents an instance where the lower electrode is formed directly on a standard polysilicon layer. Situation 2 represents an instance where the gate electrode comprises only a recrystallized polysilicon layer, and the first electrode layer is formed directly on the recrystallized polysilicon layer. Situation 3 represents an instance where the gate electrode comprises a gate electrode stack comprising both the recrystallized polysilicon layer and the polysilicon layer, and the first electrode is located on the recrystallized polysilicon layer and over the polysilicon layer.

It is noted with reference to graph 1000, that the sheet resistance and surface non-uniformity are highest for situation 1. For instance, Situation 1 shows a sheet resistance of about 32 ohms/sq and a surface non-uniformity of about 8%. In contrast, Situation 3 shows a sheet resistance of only about 24 ohms/sq and a surface non-uniformity of only about 5%. Similarly, Situation 2 shows a sheet resistance of only about 21 ohms/sq and a surface non-uniformity of about 4%. Clearly then, the use of the recrystallized polysilicon layer has its advantages. It is believed that the smoother surface of the recrystallized polysilicon layer, as compared to the standard polysilicon layer, helps provide these superior results.

FIG. 11 illustrates a table 1100 showing the surface roughness measured using an atomic force microscope (AFM) of samples similar to those of Situations 1-3 described above. It is noted that the surface roughness, in RMS (nm), measures about 3.000 for Situation 1, 1.621 for Situation 2, and 2.064 for Situation 3. Again, the advantages are apparent.

One might ask, at least in view of the information provided in FIGS. 10 and 11, why not use only a recrystallized polysilicon gate electrode, similar to Situation 2, as it provides the best sheet resistance and surface non-uniformity of the three situations. While the present invention does not wish to exclude this option, it has been observed that a gate electrode formed only of recrystallized polysilicon has a lower inversion capacitance. It is believed that this lower inversion capacitance is caused by the increased poly depletion, which may be caused by the much slower diffusion of the gate electrode dopant in the recrystallized polysilicon than in the standard polysilicon that consists of columnar grains. This, in effect, hampers the ability of the gate electrode dopant, such as boron, to diffuse to the gate electrode/gate oxide interface. This is illustrated in FIG. 12. The bi-layer stack, that is polysilicon at the bottom of the gate electrode with a layer of recrystallized polysilicon thereover (e.g., Situation 3), would address this problem.

Figure 13:
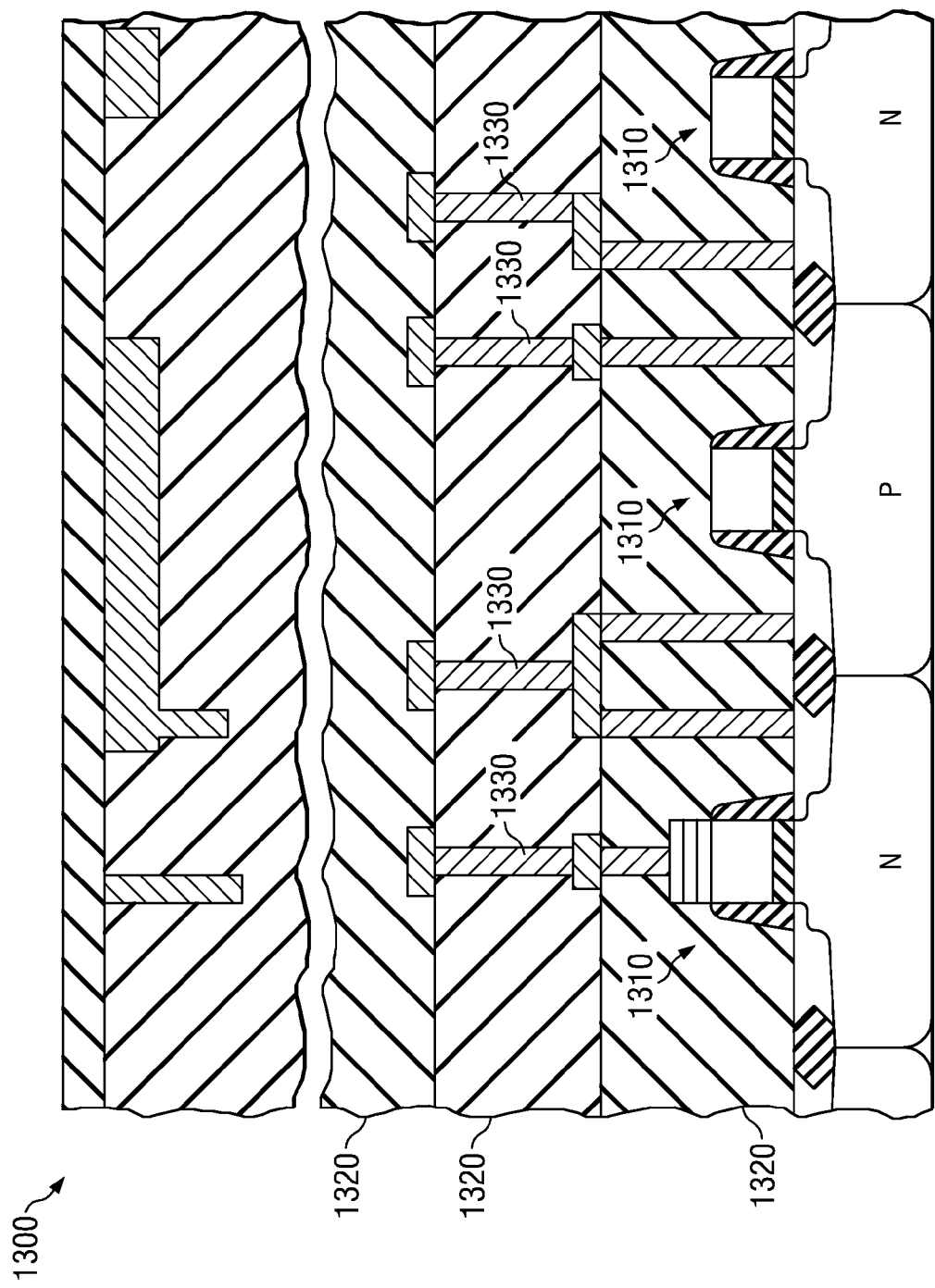
FIG. 13 is a cross-sectional view of a conventional integrated circuit (IC) incorporating devices constructed according to the principles of the present invention.

FIG. 13 illustrates a conventional integrated circuit (IC) 1300 incorporating devices 1310 constructed according to the principles of the present invention. The integrated circuit 1300 may include devices, such as transistors used to form CMOS devices, BiCMOS devices, bipolar devices, as well as capacitors or other types of devices. The integrated circuit 1300 may further include passive devices, such as inductors or resistors, or it may also include optical devices or optoelectronic devices. Those skilled in the art are familiar with these various types of devices and their manufacture. In the particular embodiment illustrated in FIG. 13, the integrated circuit 1300 includes the devices 1310 having dielectric layers 1320 located thereover. Additionally, interconnect structures 1330 are located within the dielectric layers 1320 to interconnect various devices, thus, forming the operational integrated circuit 1300.

Although the present invention has been described in terms of certain detailed embodiments, those skilled in the art should understand that various changes, substitutions and alterations may be made therein without departing from the spirit and scope of the invention in its broadest form.

What is claimed is:

1. A method for manufacturing a semiconductor device, comprising:
   forming a gate structure, the gate structure including a gate dielectric formed over a substrate, a polysilicon layer formed over the gate dielectric; and an amorphous silicon layer formed over the polysilicon layer;
   forming source/drain implants in the substrate adjacent sides of the gate structure;
   annealing to activate the source/drain implants;
   forming a layer of siliciding metal over the amorphous silicon layer;
   reacting the siliciding metal with the amorphous silicon layer acting as a source of silicon to form a metal silicide to define a first capacitor electrode;
   forming an insulator over the first capacitor electrode; and
   forming a second capacitor electrode over the insulator.

2. The method of claim 1, wherein the layer of siliciding metal comprises a cobalt layer and the silicide is a cobalt silicide.

3. The method of claim 2, wherein reacting the siliciding metal with the source of silicon comprises conducting a first thermal process to form CoSi, removing unreacted portions of the layer of siliciding metal following the first thermal process, and conducting a second thermal process to form $CoSi_2$ after removing the unreacted portions.

4. The method of claim 3, further comprising forming a capping layer over the layer of siliciding material, and removing the capping layer following the first thermal process.

5. The method of claim 1, wherein the annealing comprises an anneal conducted at a temperature of about 1000° C. to about 1100° C. for a time period of about 1 second to about 5 seconds.

6. The method of claim 1, wherein the amorphous silicon layer has a thickness of about 15 nm to about 75 nm, and the polysilicon layer has a thickness of about 50 nm to about 150 nm.

7. The method of claim 1, wherein the amorphous silicon layer includes gate electrode dopant.

8. The method of claim 7, further comprising performing a thermal anneal to activate the dopant prior to forming the metal silicide.

9. The method of claim 2, wherein the second capacitor electrode comprises titanium nitride.

10. The method of claim 1, wherein the annealing to activate the source/drain implants is after forming the amorphous silicon layer and prior to forming the metal silicide.

* * * * *